United States Patent [19]

Brown et al.

[11] 4,227,098
[45] Oct. 7, 1980

[54] SOLID STATE RELAY

[75] Inventors: Dale M. Brown; Marvin Garfinkel, both of Schenectady, N.Y.; John A. Laurent, Pittsfield, Mass.

[73] Assignee: General Electric Company, Schenectady, N.Y.

[21] Appl. No.: 13,675

[22] Filed: Feb. 21, 1979

[51] Int. Cl.[2] .................. H03K 3/42; H03K 17/60
[52] U.S. Cl. ................................. 307/311; 307/251; 307/305; 250/552
[58] Field of Search ................ 307/311, 304, 251; 328/2; 250/211 J, 552

[56] References Cited

U.S. PATENT DOCUMENTS

| 3,321,631 | 5/1967 | Biard et al. | 250/209 |
|---|---|---|---|
| 4,095,125 | 6/1978 | Ingle | 307/311 |
| 4,166,224 | 8/1979 | Hutson | 307/311 |

Primary Examiner—Stanley D. Miller, Jr.
Assistant Examiner—B. P. Davis
Attorney, Agent, or Firm—Julius J. Zaskalicky; James C. Davis, Jr.; Marvin Snyder

[57] ABSTRACT

A solid state relay having a light-emitting diode, an array of series connected photodiodes and a field effect transistor is described.

The light-emitting diode is optically coupled to the array of photodiodes. The conductive state of the transistor is determined entirely by the voltage developed by the array of photodiodes.

9 Claims, 11 Drawing Figures

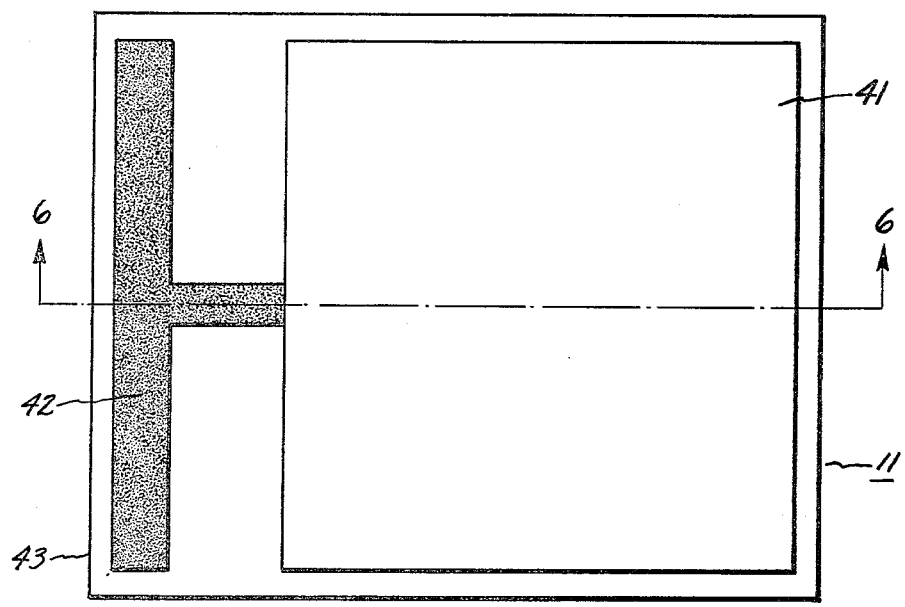
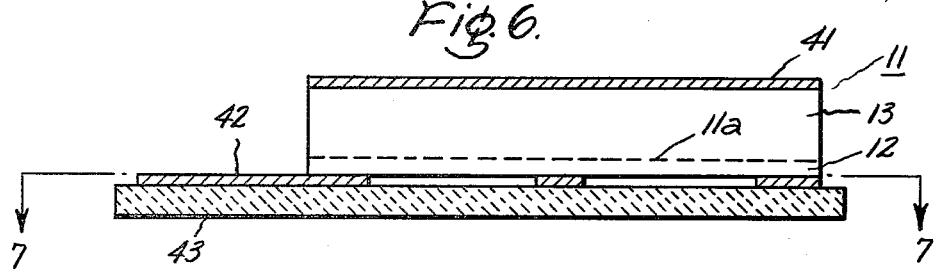
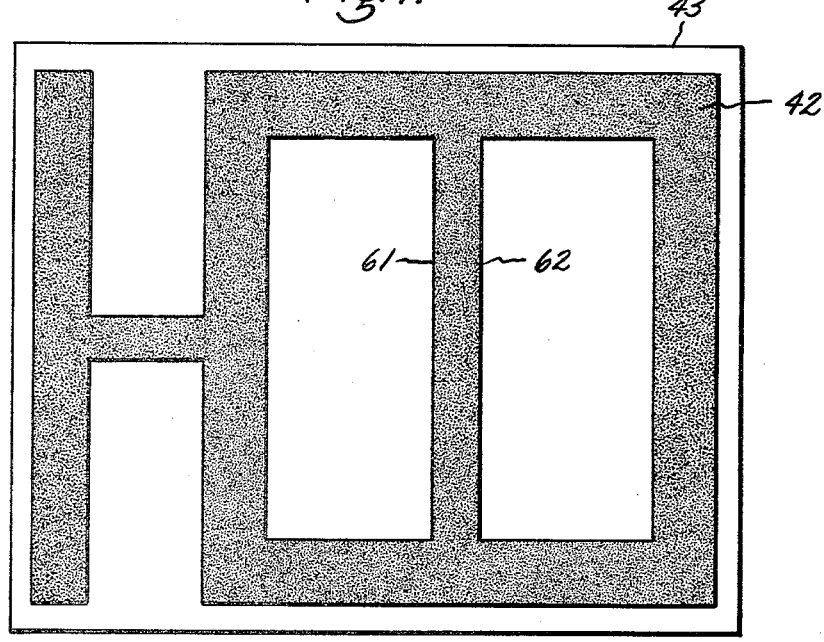

SOLID STATE RELAY

The present invention relates to a solid state relay having no moving mechanical parts which duplicates the functions of an electromechanical relay.

An object of the present invention is to provide a solid state relay which does not require external power sources for the operation thereof.

Another object of the present invention is to provide a solid state relay which is free of any off-set voltages in the output or contact circuit thereof.

Another object of the present invention is to provide a solid state relay in which the output or contact circuit thereof is suitable for operation in either AC or DC circuits.

Another object of the present invention is to provide an improved photosensitive assembly suitable for incorporation in systems such as solid state relays.

A further object of the present invention is to provide a photodiode array which provides output voltages substantially greater than the output voltage of a single photodiode.

In carrying out the invention in one illustrative embodiment thereof, there is provided a light-emitting diode connected to a pair of input terminals for generating radiation in response to current applied to the input terminals. An array of photodiodes connected in series between a pair of array electrodes and optically coupled to the light-emitting diode is provided for developing a control voltage across the array electrodes in response to radiation from the light-emitting diode. A field effect transistor including a pair of current carrying electrodes, a gate electrode and a substrate electrode is provided. One of the array electrodes is connected to the gate electrode of the transistor and the other of the array electrodes is connected to the substrate electrode. Thus, the impedance between the current carrying electrodes of the transistor has one value in the absence of, and another greatly different value in the presence of the control voltage provided by the diode array. A large resistive impedance is connected between the gate electrode and the substrate electrode to discharge the gate-to-substrate capacitance of the transistor on cessation of current flow between the input terminals of the relay. A pair of output terminals corresponding to contact electrodes of an electromechanical relay are provided, one of which is connected to one current carrying electrode and the other of which is connected to the other current carrying electrode of the transistor.

An important aspect of the present invention is the provision of an array of photodiodes located in a common substrate in which each of the photodiodes is dielectrically isolated from the other photodiodes and the substrate as well. The photodiodes are connected in series to enable an output voltage to be obtained which is substantially the sum of the voltages of the diodes of the array. In photodiode arrays located in a common substrate various photodiode isolation arrangements have been used including such expedients as reversely biased PN junctions. Such arrangements inherently included parasitic impedance interconnections which considerably reduce the magnitude of voltages obtainable.

The features which are believed to be characteristic of the present invention are set forth with particularity in the appended claims. The invention itself, both as to its organization and method of operation, together with further objects and advantages thereof, may best be understood by reference to the following description taken in connection with the accompanying drawings wherein:

FIG. 5 is a plan view of the light-emitting diode assembly of the embodiment of FIG. 3.

FIG. 6 is a sectional view of the light-emitting diode assembly of FIG. 5 taken along section lines 6—6 of FIG. 5.

FIG. 7 is a sectional view of a portion of the light emitting diode assembly of FIG. 5 taken along section lines 7—7 of FIG. 6.

Figure 1:
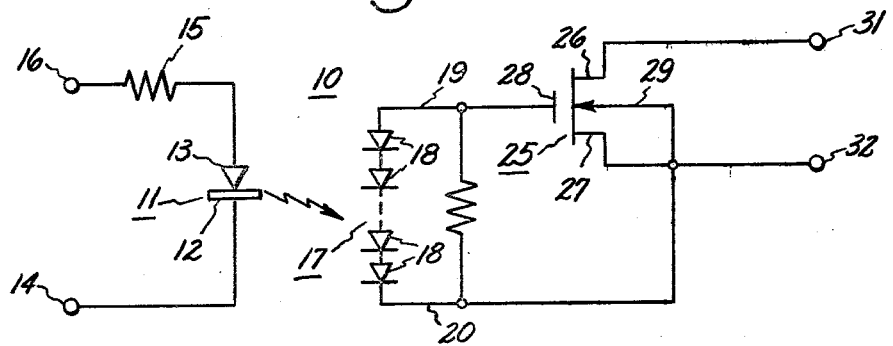
FIG. 1 is a schematic diagram of one embodiment of a solid state relay in accordance with the present invention.

Reference is now made to FIG. 1 which shows a schematic diagram of one embodiment of the present invention. The solid state relay 10 comprises a light-emitting diode 11 having a cathode 12 and an anode 13, an array 17 of photodiodes 18 connected in series aiding relationship between a pair of electrodes 19 and 20 with electrode 19 connected to the anode of the photodiode at one end of the array and electrode 20 connected to the cathode of the photodiode at the other end of the array, and an insulated gate field effect transistor 25 including a pair of current carrying electrodes 26 and 27, a gate electrode 28 and a substrate electrode 29. The insulated gate field effect transistor 25 may be either an enhancement mode transistor or a depletion mode transistor and may be either P-channel or N-channel, although N-channel transistors are preferred in view of the higher conductivity which may be obtained between the electrodes thereof. A pair of "coil" or input terminals 14 and 16 are provided corresponding to the coil terminals of an electromechanical relay. The cathode 12 of the light-emitting diode is connected to terminal 14. The anode 13 of the light-emitting diode 11 is connected through a current limiting resistance 15 to terminal 16. The photodiode array 17 is coupled to the light-emitting diode 11 to receive radiation developed thereby. Electrode 19 of the diode array 17 is connected to the gate 28 of the transistor 25. The other electrode 20 of the photodiode array 17 is connected to the substrate 29 of the transistor 25 and also to the current carrying electrode 27. For operation of the relay in direct current circuits it is preferable to connect the substrate 29 to one of the current carrying electrodes 27 which then acts as the source of the insulated gate field effect transistor. A pair of output terminals 31 and 32 are provided with output terminal 31 connected to current carrying electrode 26 and output terminal 32 connected to the current carrying electrode 27. A discharge resistor 21 is connected between the electrodes 19 and 20 of the diode array 17 to enable charge on the gate electrode, and hence the voltage thereon, to discharge on the cessation of current flow between input terminals 14 and 16.

The operation of the solid state relay circuit of FIG. 1 will now be explained. It is assumed that the insulated gate field effect transistor 25 is an N-channel enhancement mode transistor. The application of a forward current of sufficient magnitude between the input terminals 14 and 16 will cause the light-emitting diode 11 to emit radiation. The series connected photodiode array 17 develops across the electrodes 19 and 20 a voltage which is the sum of the voltages developed in each of the individual photodiodes in response to the received radiation. The voltage between the array electrodes 19 and 20 is applied between the gate electrode 28 and the substrate electrode 29 of the transistor 25. As the gate electrode is positive with respect to the substrate electrode, a conduction or low resistance channel is established between the electrodes 26 and 27 thereby completing a circuit between output terminals 31 and 32 representing a contact closure of an electromechanical relay. In the absence of current flow between the input terminals 14 and 16, no voltage is developed across the electrodes of the diode array 17 and consequently the impedance appearing across the output terminals 31 and 32 is high representing an open circuit or open contact condition. In this circuit it is required that electrode 32 be connected to a portion of the external circuit (not shown) which is more negative than the portion of the external circuit to which the output terminal 31 is connected. If the transistor 25 were a depletion mode transistor instead of an enhancement mode transistor on the same conductivity type substrate and the polarity of the voltage from the diode array 17 applied between gate electrode 28 and substrate 29 of the transistor were reversed, the impedance between the output terminals 31 and 32 would be a low impedance in the absence of voltage on the gate of the transistor, representing contact closure of the electromechanical relay. Upon application of a voltage of the indicated reverse polarity to the gate electrode of the depletion mode transistor in response to current flow between input terminals 14 and 16, a high impedance condition would be established between the current carrying electrodes 26 and 27, representing an open circuit or open contact condition of the relay.

Figure 2:
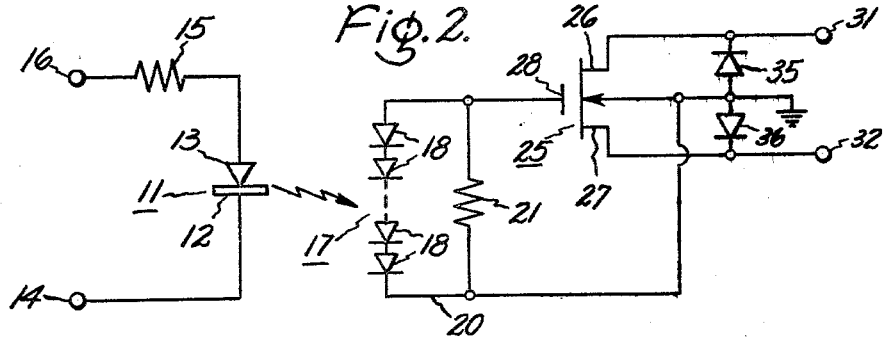
FIG. 2 is a schematic diagram of another embodiment of a solid state relay in accordance with the present invention.

Reference is now made to FIG. 2 which shows a schematic diagram of another embodiment in accordance with the present invention. The embodiment of FIG. 2 is similar to the embodiment of FIG. 1 with certain modifications. The embodiment of FIG. 2 is suitable for use with external circuits having AC voltages associated therewith connected to the output terminals 31 and 32. This embodiment is also suitable for bilateral operation in external circuits having DC voltages associated therewith. The circuit elements of FIG. 2 identical to the circuit elements of FIG. 1 are identically designated. In FIG. 2 the substrate connection 29 of transistor 25 is connected to ground instead of to one of the current carrying electrodes 26 and 27. In addition, a pair of diodes 35 and 36 are provided for an N-channel enhancement mode field effect transistor 25. The anode of diode 35 is connected to the substrate and the cathode thereof is connected to the current carrying electrode 26. The anode of the diode 36 is also connected to the substrate 29 or ground and the cathode thereof is connected to the current carrying electrode 27. In an enhancement mode transistor the substrate would be of P-type conductivity and the current carrying electrodes 26 and 27 would be of N-type conductivity. Thus, each of the diodes 35 and 36 are connected in parallel with the PN junctions formed by the current carrying electrodes with respect to the substrate. The diodes 35 and 36 are selected with respect to the forward conduction condition such that forward conduction occurs at a lower voltage than the voltage at which forward conduction would occur in the PN junctions of the transistor. For insulated gate field effect transistors formed on silicon substrates forward conduction of PN junctions occurs at about 0.6 volt. Accordingly, Schottky diodes constituted of silicon or germanium PN junction diodes having a forward conduction voltage which is a fraction of the forward conduction voltage of PN junctions in silicon would be suitable. When the voltage on electrode 31, for example, drops below ground it will cause diode 35 to conduct before the PN junction associated with electrode 26 conducts thereby connecting terminal 31 and also electrode 26 to the substrate and providing a circuit configuration similar to the circuit configuration depicted in FIG. 1. Thus, transistor 25 can be turned on upon the appearance of a sufficiently large voltage on the gate electrode 28. Conversely, when the voltage on electrode 32 drops below ground, the other diode 36 conducts and electrode 27 is now connected to ground and substrate. Thus, the transistor again can be turned on or rendered conductive upon the appearance of a voltage of sufficient magnitude on gate electrode 28. In the absence of such diodes so connected and of the forward conductance characteristics specified, the AC signal appearing across the output terminals 31 and 32 would cause the transistor to conduct in the absence of voltage appearing on the gate electrode 28 due to injection of carriers from the current carrying electrode into the substrate. The 35 and 36 diodes would also be connected for depletion mode transistors.

Figure 3:
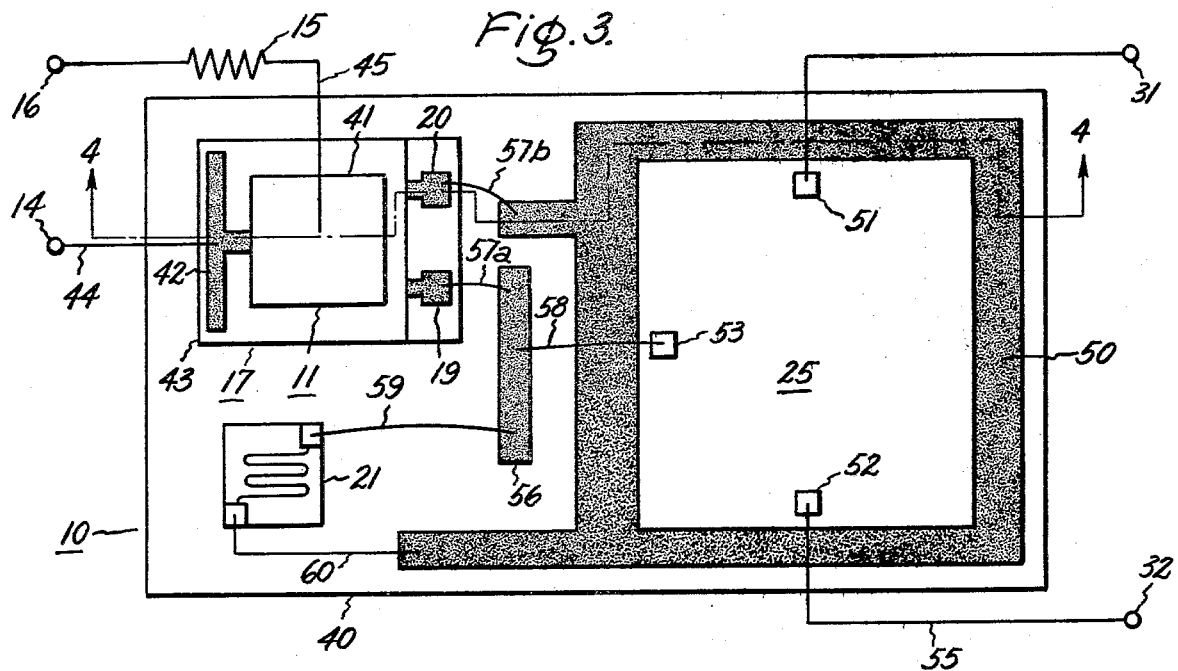
FIG. 3 is a plan view of an implementation of the embodiment shown in schematic form in FIG. 1.

Reference is now made to FIG. 3 which shows an implementation of the solid state relay circuit of FIG. 1. The elements of FIG. 3 corresponding to the elements of FIG. 1 are identically designated. The solid state relay 10 shown in FIG. 3 includes the light-emitting diode subassembly 11, the photodiode array 17, the insulated gate field effect transistor 25 and the resistance 21, all mounted on a common ceramic substrate 40. The light-emitting diode 11 includes an upper conductor 41 connected to the anode of the light-emitting diode 11 and a lower conductor 42 bonded to the cathode 12 of the diode and also bonded to a thin glass substrate 43 for supporting the light-emitting diode assembly. The PN junction 11a (FIG. 6) of the light-emitting diode 11 is located near the lower electrode 42 which is provided with large openings enabling light to be transmitted therethrough. A lead 44 connects lower conductor 42 and cathode 12 of the light-emitting diode to the input terminal 14. A lead 45 connects the anode of the light-emitting diode to one end of current limiting resistance 15 the other end of which is connected to input terminal 16. The structure of the light-emitting diode assembly 11 and the manner in which it is fabricated will be described in greater detail below in connection with FIGS. 5, 6 and 7.

The photodiode array assembly includes a polycrystalline substrate 46 adjacent the upper surface of which is located a plurality of silicon diodes each isolated from the substrate and from each other by an insulating dielectric layer of silicon dioxide. Conductive connections are provided insulatingly overlying the surface of the diodes for interconnecting dissimilar electrodes of adjacent diodes to form an array of diodes connected in series between a pair of electrodes of the array designated conductors 19 and 20. The lower surface of the polycrystalline silicon substrate of the diode array is bonded to the ceramic substrate 40. The supporting glass member 43 of the light-emitting diode 11 is bonded to the upper face of the diode assembly 17 and in registry with the diodes of the diode array by a layer of transparent epoxy 49. Thus, in response to current applied to input terminals 14 and 16, light is generated in the light-emitting diode 11 which is transmitted through the glass substrate 43 and the transparent epoxy bonding member 49 onto the photodiode array and generates a voltage across the conductor members 19 and 20. Further details on the structure of the photodiode array and the manner of fabrication thereof will be described below in connection with FIGS. 8 and 9.

The insulated gate field effect transistor 25 includes a substrate which is electrically bonded to a metallization layer 50 on the substrate 40 which provides the substrate connection or terminal 29 of the device and also provides a ground reference plane for the solid state relay. The transistor assembly 25 also includes a pair of conductive pads 51 and 52 conductively connected to respective electrodes 26 and 27 of transistor 25, and a conductive pad 53 connected to the gate electrode 28 of the transistor. Conductive pad 51 is connected to output terminal 31 by lead 54 and conductive pad 52 is connected to output terminal 32 by lead 55. A conductive pad 56 bonded to the substrate 40 is provided to facilitate interconnection of the various circuit elements of the solid state relay. Lead 57a provides conductive connection between conductor 19 and conductive layer 56. Lead 57b provides a conductive connection between conductor 20 and conductive layer 50. Lead 58 provides conductive connection between gate pad 53 and conductive layer 56. Lead 59 provides conductive connection between one end of resistance 21 to the layer 56. Lead 60 provides conductive connection between the other end of resistance 21 to ground layer 50. Further details on the structure of the transistor 25 and the manner of fabrication thereof will be described below in connection with FIGS. 10 and 11.

Reference is now made to FIGS. 5, 6 and 7 which show the light-emitting diode assembly 11. FIG. 5 shows a plan view of the assembly in which appears the upper metalization 41 connected to the anode of the light-emitting diode and the glass substrate 43 on which is mounted the conductor 42 connected to the cathode of the light-emitting diode. As shown in FIG. 7, the portion of the conductor 42 on which the light-emitting diode 11 is mounted comprises a portion of rectangular outline having large openings 61 and 62 for permitting the passage of light from the light-emitting diode into the photodiode array.

Figure 8:
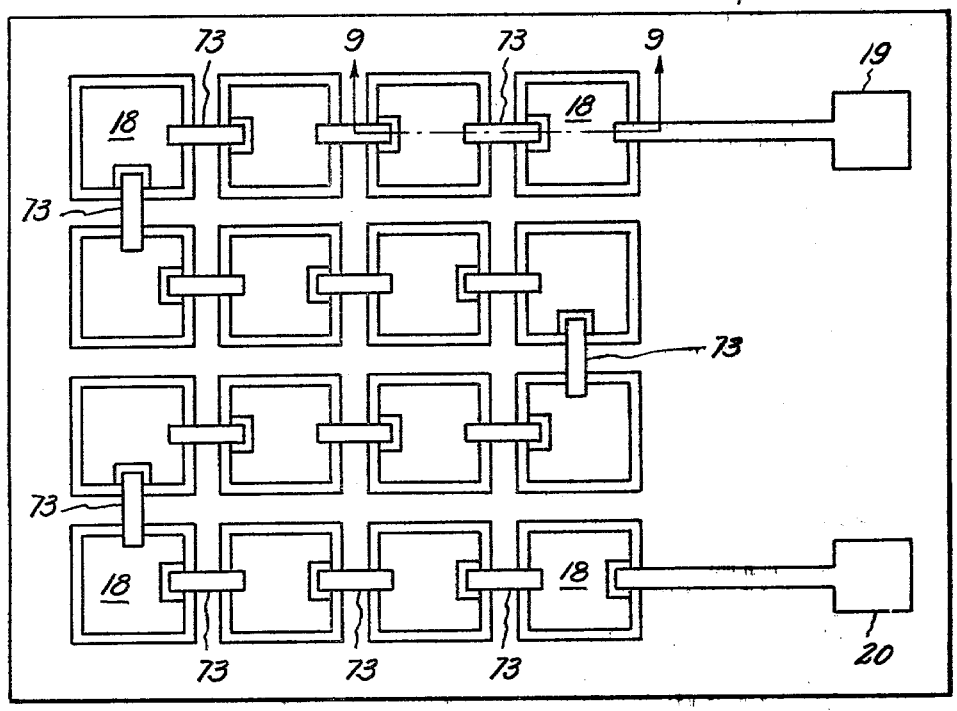
FIG. 8 is a plan view of the photodiode array of the embodiment of FIG. 3.
Figure 9:
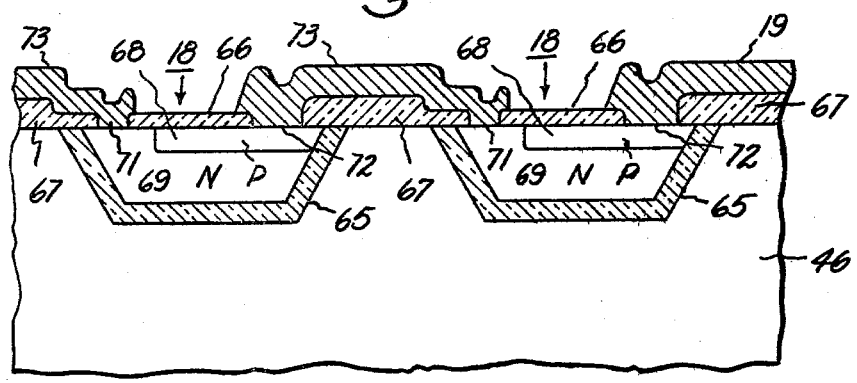
FIG. 9 is a sectional view of the photodiode array assembly of FIG. 8 taken along section lines 9—9 of FIG. 8.

Reference is now made to FIGS. 8 and 9 showing the photodiode array. The photodiode array comprises a polycrystalline substrate 46 in the upper surface of which are provided a plurality of silicon dioxide pockets 65 in each of which is contained a planar diode 18. A thin layer 66 of silicon dioxide overlies each of the diodes. Thick silicon dioxide 67 is provided elsewhere over the diode array. Each of the diodes includes a p-type region 68 constituting the anode and an underlying n-type region 69 constituting the cathode of the diode. In the thin layer 66 of silicon dioxide overlying each of the diodes a pair of openings 71 and 72 are provided to access the cathode and anode of the diode. Metal aluminum interconnecting conductors 73 are provided connecting the cathode of a diode to the anode of an adjacent diode in the manner indicated in FIG. 8 except for the diode in the upper right hand corner of the array and the diode in the lower right hand corner of the array. The p-region of the diode 18 in the upper right hand corner of the array is connected to conductor 19 and the n-region of the diode in the lower right hand corner of the array is connected to the conductor 20.

The photodiode array of FIGS. 8 and 9 may be formed in the following manner. Starting with a wafer of single crystalline silicon a plurality of mesas are formed in one face of the wafer by masking and etching techniques well-known to those skilled in the art. The mesas are then oxidized to form the silicon dioxide pockets 65. The space between the oxidized mesas are filled with polycrystalline silicon using well-known pyrolysis techniques to form the substrate 46. Thereafter the opposite face of the silicon wafer is ground, lapped and etched to form the structure shown in which the single wafer of single crystalline silicon has been divided into a plurality of pieces, each dielectrically isolated from the polycrystalline substrate 46 and from each other. Standard planar silicon processing is utilized to provide planar diodes which have the structure indicated and are covered with a layer of thin silicon dioxide 66 bounded by a layer of thick silicon dioxide 67.

Figure 10:
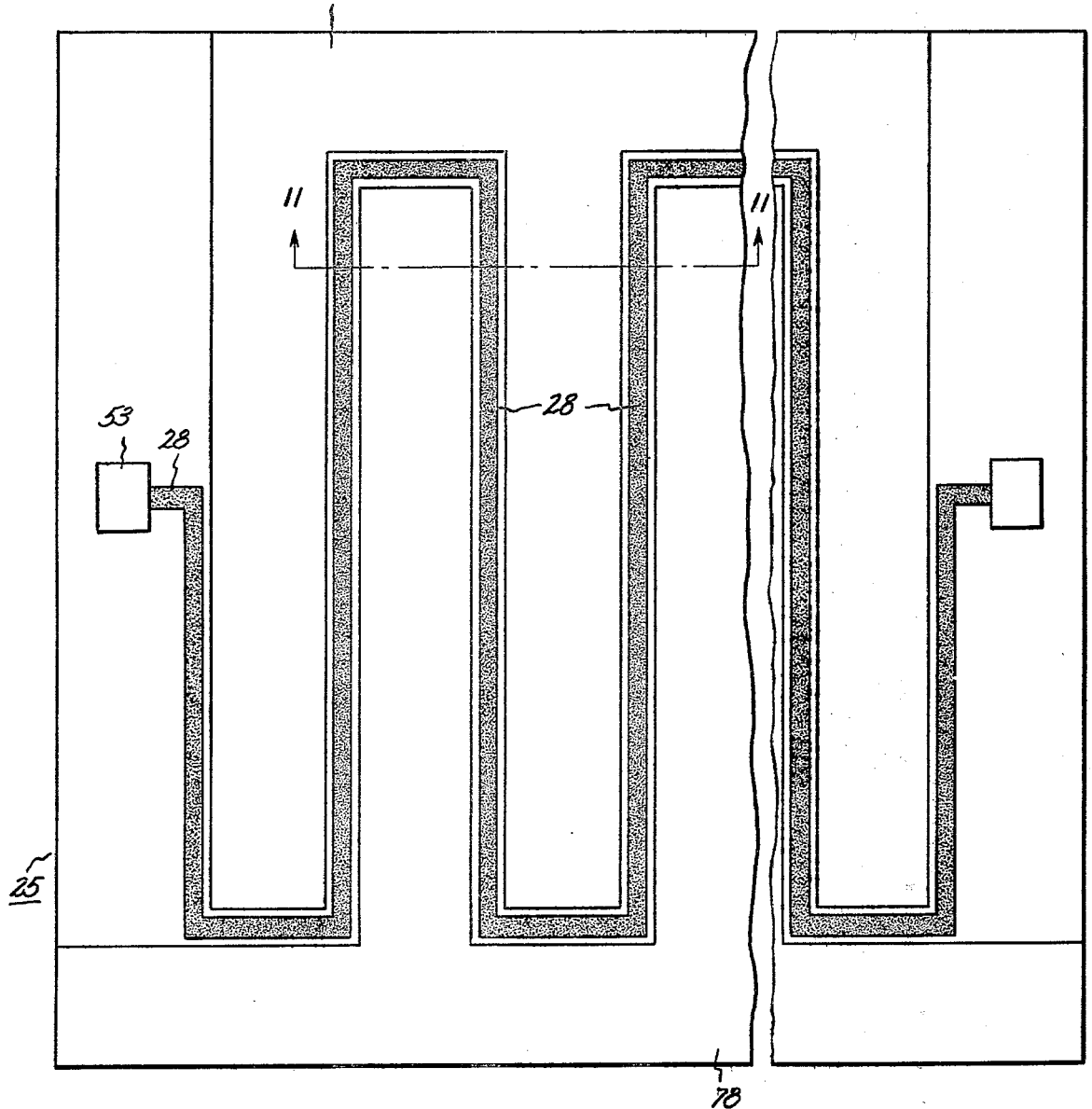
FIG. 10 is a plan view of the insulated gate field effect transistor assembly of the embodiment of FIG. 3.
Figure 11:
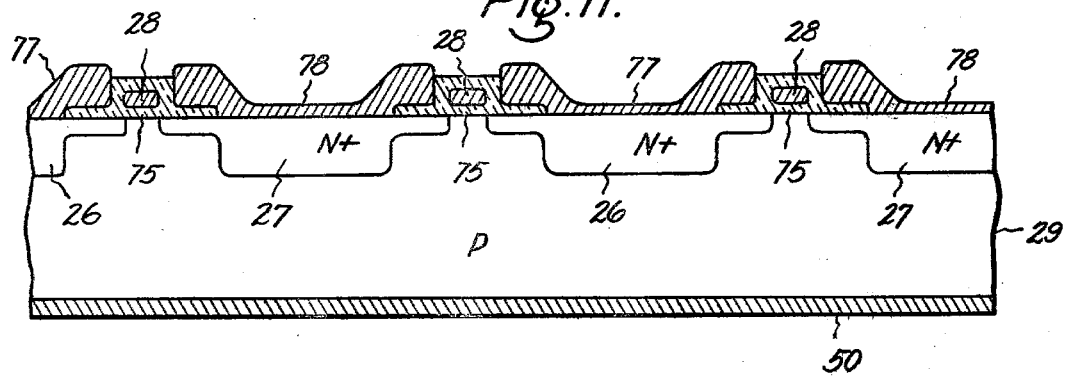
FIG. 11 is a sectional view of the assembly of FIG. 10 taken along such lines 11—11 of FIG. 10.

Reference is now made to FIGS. 10 and 11 which show a high performance, high aspect ratio insulated gate field effect transistor 25. The transistor 25 comprises a p-type conductivity single crystal wafer constituting the substrate 29 in which a first set of n-type conductivity fingered regions 26 are interdigitated or interleaved with a second plurality of n-type conductivity fingered regions 27. At the upper surface of the substrate 29 the n-type region 26 is uniformly spaced from the n-type region 27 by a short distance which is referred to as the channel distance. The channel extends in serpentine or folded fashion from one side of the substrate to the other. The channel is covered by a thin layer of silicon dioxide 75 over which lies a conductive gate electrode 28 in registry with the folded channel region. A metal conductor 77 is bonded to the fingered electrode 26 and the conductor 78 is bonded to the fingered electrode 27. The assembly shown may be covered with an insulating layer of a silicon dioxide, for example, and apertures provided in the insulating layer for making connections to the conductors 77, 78 and 28. Pads 51, 52 and 53 are then provided on the insulating layer as shown in FIG. 3 and conductive connection is made through apertures in the silicon dioxide layer to the conductors 77, 78 and 28, respectively.

Figure 4:
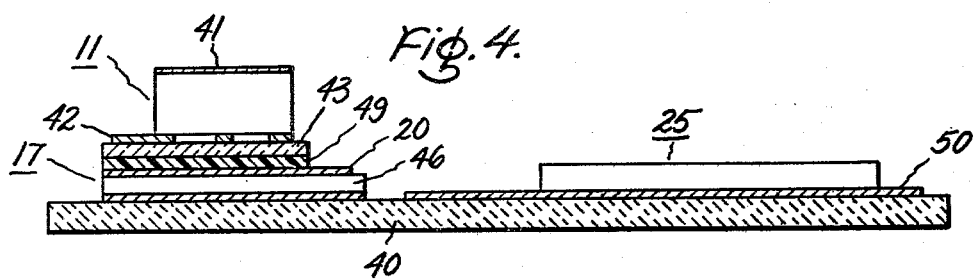
FIG. 4 is a sectional view of the embodiment of FIG. 3.

In an implementation of the invention in a solid state relay, such as shown in FIGS. 3 and 4, a light-emitting diode 13 constituted of galium arsenide having a PN junction area of approximately 900 square mils (a mil is one-thousandth of an inch) was provided on an array consisting of 20 planar diodes having the structure shown in FIGS. 8 and 9 with each diode having a junction area of about 16 square mils. An enhancement mode insulated gate field effect transistor constituted of a silicon substrate with a channel length of 4 microns and an aspect ratio of 10,000 was provided. The gate to substrate capacitance of the transistor was approximately 60 picofarads. A discharge resistance 21 of approximately 15 megohms was provided in the relay. In the absence of current flow between the input terminals 15 and 16 of the relay, the impedance between the output terminals was measured to be approximately 1000 megohms. A current of 20 milliamperes was applied at the input terminals and after 1 millisecond, the impedance of the output terminals was reduced to 2 ohms. Upon removal of input current to the relay the impedance between the output terminals reverted to its original value after 1 millisecond.

To provide the implementation shown in FIG. 2 diodes 35 and 36 would be constituted as Schottky diodes having a forward conduction voltage smaller than the forward conduction voltage of the PN junctions of the insulated gate field effect transistor and would be secured to the substrate 50 with connections thereto provided as shown in FIG. 2. With these changes in the implementation shown in FIGS. 3 and 4, the solid state relay would be suitable for switching AC loads.

While a resistance 21 is shown connected between the gate and substrate of the field effect transistors of FIGS. 1 and 2, it will be understood that such resistance may be provided by active devices such as transistors.

While the field effect transistor of the embodiment of FIG. 2 requires symmetrical source and drain structures, the field effect transistor of FIG. 1 may be non-symmetrical. In the embodiment of FIG. 1, non-symmetrical transistors such as vertical field effect transistors may be used.

A particular advantage of the solid state relay of the present invention is that degradation of the light output of the light-emitting diode with age will not effect the steady state voltage attained in the photodiode array. It would decrease the short circuit thereby increasing the time at which the steady state voltage is reached. Thus, degradation of light-emitting diode performance would not affect the turn on of the transistor. It would only delay and increase the time of turn on of the transistor, and hence contact closure.

As the steady state output voltage of the photodiode array is essentially independent of the current flow in the photodiode array, and hence the light output of the light-emitting diode, the relay of the present invention is suitable for operation on AC input currents. However, in AC input operation, as light output occurs in pulses, steady state voltage of the photodiode array is not reached as soon as with DC input operation. Thus, in AC input operation the response of the relay would be slower than with DC input operation. Of course, the peak AC voltage would have to be limited to a value below the reverse breakdown voltage of the light-emitting diode.

While the invention has been described in specific embodiments, it will be understood that modifications may be made by those skilled in the art, and it is intended by the appended claims to cover all such modifications and changes as fall within the true spirit and scope of the invention.

What we claim as new and desire to secure by Letters Patent of the United States is:

1. A solid state relay comprising
    a pair of input terminals,
    a light-emitting diode connecting to said input terminals for generating radiation in response to current applied to said input terminals,
    an array of photodiodes series connected between a pair of array electrodes and optically coupled to said light-emitting diode for developing a control voltage across said array electrodes in response to radiation from said light-emitting diode,
    a field effect transistor including a pair of current carrying electrodes, a gate electrode and a substrate electrode, one of said array electrodes connected to said gate electrode and the other of said array electrodes connected to said substrate electrode whereby the impedance between said current carrying electrodes has one value in the absence of, and another greatly different value in the presence of said control voltage between said gate electrode and said substrate electrode,
    means for providing a large resistive impedance between said gate electrode and said substrate electrode,
    a pair of output terminals, each connected to a respective one of said current carrying electrodes.

2. The solid state relay of claim 1 in which said field effect transistor is an insulated gate field effect transistor.

3. The solid state relay of claim 1 in which said field effect transistor is an enhancement mode insulated gate field effect transistor.

4. The solid state relay of claim 1 in which said field effect transistor is a depletion mode insulated gate field effect transistor.

5. The solid state relay of claim 1 in which said array of diodes is a planar array of diodes, each dielectrically isolated from one another in a common substrate.

6. The solid state relay of claim 2 in which said substrate is connected to a fixed reference potential point and in which a pair of rectifying diodes is provided, each connected between a respective current carrying electrode and said reference potential point and poled to conduct in the same direction with respect to the substrate as the current carrying electrode to which it is connected, the voltage at which conduction occurs in each of said rectifying diodes being substantially less than the voltage at which a respective current carrying electrode conducts with respect to said substrate.

7. The solid state relay of claim 2 in which the aspect ratio of said insulated gate field effect transistor is very large.

8. The solid state relay of claim 1 in which said substrate electrode is connected to one of said current carrying electrodes.

9. The solid state relay of claim 2 in which said current carrying electrodes are symmetrical with respect to said substrate.

* * * * *